United States Patent
Steffens et al.

(10) Patent No.: US 9,678,153 B2
(45) Date of Patent: Jun. 13, 2017

(54) METHOD FOR DETERMINING TIME DIFFERENCES BETWEEN SIGNALS MEASURED BY AT LEAST TWO COUPLED MEASURING DEVICES AND MEASUREMENT SYSTEM AND CORRESPONDING SWITCHING DEVICE

(75) Inventors: Johannes Steffens, Rosenheim (DE); Markus Freidhof, Kirchseeon (DE); Kurt Schmidt, Grafing (DE); Manfred Mueller, Muehldorf (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 773 days.

(21) Appl. No.: 12/596,129

(22) PCT Filed: Mar. 25, 2008

(86) PCT No.: PCT/EP2008/002348
§ 371 (c)(1),
(2), (4) Date: Oct. 15, 2009

(87) PCT Pub. No.: WO2008/125184
PCT Pub. Date: Oct. 23, 2008

(65) Prior Publication Data
US 2010/0121597 A1    May 13, 2010

(30) Foreign Application Priority Data

Apr. 17, 2007  (DE) ........................ 10 2007 018 096

(51) Int. Cl.
*G01R 29/00* (2006.01)
*G01R 31/317* (2006.01)
*G01R 13/02* (2006.01)

(52) U.S. Cl.
CPC ... *G01R 31/31725* (2013.01); *G01R 13/0254* (2013.01); *G01R 31/31726* (2013.01)

(58) Field of Classification Search
USPC ..... 702/79, 89, 125, 127, 176, 187; 700/306
See application file for complete search history.

(56) References Cited

U.S. PATENT DOCUMENTS 3,842,247 A * 10/1974 Anderson ...................... 702/58
6,066,953 A    5/2000 Wadell
(Continued)

FOREIGN PATENT DOCUMENTS

DE        38 08 304 A1    9/1989
DE      101 31 712 A1     1/2003
(Continued)

*Primary Examiner* — John Breene
*Assistant Examiner* — Yaritza H Perez Bermudez
(74) *Attorney, Agent, or Firm* — Christensen O'Connor Johnson Kindness PLLC

(57) ABSTRACT

The invention relates to a method and to a switching device (4) and a measurement system (1). In the method according to the invention for determining time differences between measurement signals measured by at least two couple measurement devices (2, 3), a time basis signal is first generated for the measurement devices (2, 3). A common reference signal is further generated by a signal generator (5). The common reference signal is fed to measurement signal inputs (8, 9) of the coupled measuring devices (2, 3) via the switching device (4). A measurement signal is then fed to said measurement signal inputs (8, 9) of the coupled measuring devices (2, 3) and the time position of the measurement signals relative to the reference signal is determined in each of the coupled measuring devices (2, 3). The switching device (4), to this end, has a first measuring device connection (12) and a second measuring device connection (13) connected to the measurement signal inputs (8, 9) of the first measuring device (2) and the second measuring device (3). A reference signal is alternately fed via the measuring device connections (12, 13) of the switching device (4) to the first or the second measuring device (2, 3) by connecting the first (Continued)

Figure 1:
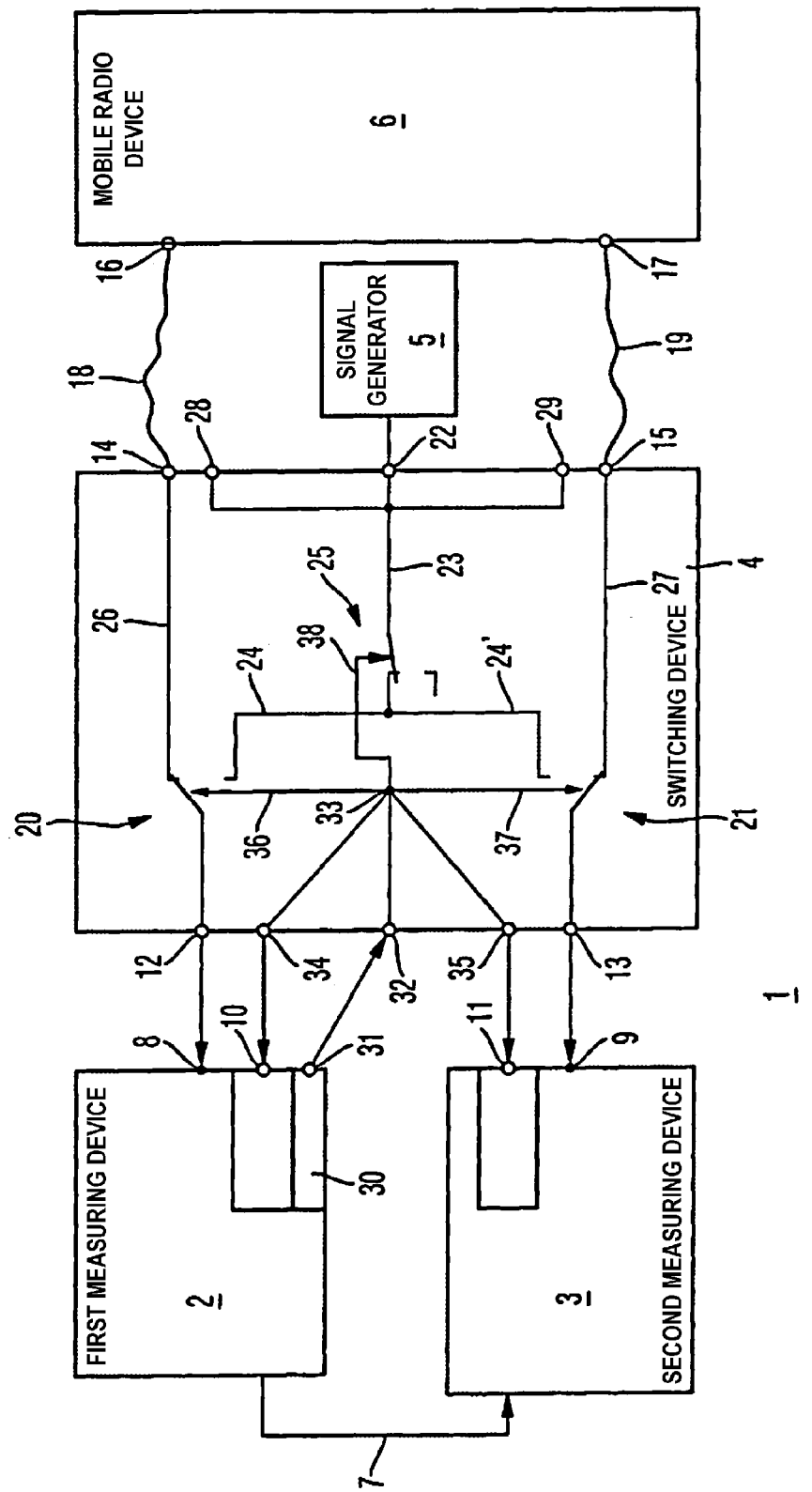

measuring device connection (12) to the reference signal input (22) or a first measuring connection (14), or by connecting the second measuring device connection (13) to the reference signal input (22) or the second measuring connection (15).

12 Claims, 2 Drawing Sheets

(56) References Cited

U.S. PATENT DOCUMENTS

| | | | |
|---|---|---|---|
| 7,116,267 B2 * | 10/2006 | Schuster | H01Q 3/267 |
| | | | 342/165 |
| 2006/0055394 A1 | 3/2006 | Dunsmore | |
| 2006/0111861 A1 * | 5/2006 | Horne et al. | 702/89 |
| 2007/0152509 A1 * | 7/2007 | Bucher et al. | 307/119 |

FOREIGN PATENT DOCUMENTS

| | | |
|---|---|---|
| DE | 103 31 092 A1 | 2/2005 |
| DE | 10 2004 034 879 A1 | 3/2005 |
| EP | 0 566 823 A2 | 10/1993 |
| WO | 99/21025 A1 | 4/1999 |
| WO | 00/46612 A1 | 8/2000 |
| WO | WO 0046612 A1 * | 8/2000 |

* cited by examiner

METHOD FOR DETERMINING TIME DIFFERENCES BETWEEN SIGNALS MEASURED BY AT LEAST TWO COUPLED MEASURING DEVICES AND MEASUREMENT SYSTEM AND CORRESPONDING SWITCHING DEVICE

The invention relates to a method for determining time differences between signals measured by at least two coupled measuring devices, a corresponding measurement system for the implementation of the method and a switching device.

A coupling together of two measuring devices is known from DE 103 31 092 A1. These two measuring devices are coupled in each case with their one test-signal input to a device under test, in order to analyse signals generated by this device under test. In order to operate two such measuring devices together within a measurement system, it is necessary to synchronise the two measuring devices. To this end, DE 103 31 092 proposes the provision of a frequency generator phase-regulated via a phase-locked loop in each of the measuring devices and the connecting together of the outputs and phase-synchronisation inputs of the two measuring devices. This achieves an absolute phase synchronisation between the two measuring devices coupled to a measurement system.

The disadvantage with the measurement system described in DE 103 31 092 A1 is that an exact phase position of the two measuring devices relative to one another is, in fact, ensured, but, for example, different delay times of the test signals on the signal path leading to the final analysis are still ignored. Accordingly, a time offset, which occurs between the test signal incoming in the respective measuring device and a test signal incoming in the other measuring device, is not detected.

The invention is therefore based upon the object of providing a method, a measurement system and a corresponding switching device, with which a time offset of the test signals incoming in the measuring devices can be determined.

The object is achieved by the method according to the invention with the features of claim 1, the switching device with the features of claim 8 and the measurement system with the features of claim 14.

With the method according to the invention, time differences are determined between signals measured by two coupled measuring devices. To this end, a time basis signal is initially generated for the measuring devices to synchronise the coupled measuring devices to a common time basis. Furthermore, a common reference signal is generated by a signal generator. The common reference signal is supplied to the test-signal inputs of the coupled measuring devices and, after this, one test signal is supplied to each of the test-signal inputs of the coupled measuring devices. Since a common reference signal is initially supplied to each of the test-signal inputs, the relative position of the individually-registered test signal, which is then supplied in the actual measurement to the test-signal input, relative to the reference signal the exact time position of the two test signals relative to one another can be determined. In this context, it is crucial that the common reference signal forms the time reference for the test signals, wherein this reference signal is initially supplied in the implementation of a measurement via the respective test-signal input of the coupled measuring devices. Accordingly, the time differences between the test signals, which occur, for example, as a result of cable lengths or internal delay times in the measuring devices, and are not registered by a synchronisation of the coupled measuring devices or respectively cannot be prevented, are determined. These can then be taken into consideration in calculations.

To this end, a switching device according to the invention provides a first measuring-device port and at least a second measuring-device port and a reference signal input. The first measuring-device port can optionally be connected to the reference signal input or to a first measurement port, and the second measuring-device port can optionally be connected to the reference signal input or respectively to a measurement port. In this manner, corresponding to the measurement system according to the invention, each of the measuring devices can be connected with its test-signal input to the corresponding measuring-device port of the switching device. Through the switching device, either the common reference signal or a respectively-allocated test signal can then be supplied to the respective measuring-device port and accordingly to the test-signal input of the measuring devices.

The dependent claims relate to advantageous further developments of the method according to the invention and the switching device according to the invention.

The switchover between the supply of the common reference signal and the respective test signals is preferably controlled via a trigger signal, which is generated by one of the measuring devices. This has the advantage that the time sequence during the implementation of a measurement is controlled by one of the measuring devices and, as a result, is implemented in common for all coupled measuring devices and, in particular, the switchover between the supplied reference signal and the respectively-supplied test signal takes place simultaneously.

By preference, a controllable output port of the measuring device is controlled in order to control the switchover. Such a control of the output port of the measuring device can also be implemented by the respective software used and executed in the measuring device. The use of such a controllable output port therefore also offers the possibility of generating a trigger signal with measuring devices, which do not have at their disposal a hardware-implemented trigger output provided for this purpose. The controllable output port can also be, for example, a printer port, a serial port or a USB port.

In this context, the trigger signal is preferably supplied in each case to a trigger input of each of the coupled measuring devices and to the switching device. Accordingly, not only the switchover process, that is to say, the switchover between the common reference signal and the respective test signal, is controlled in time in the switching device by the trigger signal, but the time sequence of the actual measurement is also controlled through the supply of the trigger signal to the coupled measuring devices.

For example, the recording of the sampled values by the measuring device is therefore also triggered in time by the trigger signal. A particularly simple implementation of the method is possible, if the trigger signal is generated by control software in the measuring device. In particular, this allows the time sequence to be influenced simply by a user. Accordingly, with one preferred embodiment, it is possible to switch periodically between the reference signal and the respective test signals during the implementation of a measurement. In this context, the time interval, which is provided for the recording of the actual test signal, can be adjusted individually.

Moreover, to determine further occurring delay-time differences, which arise, for example, through the cable used for the connection of the device under test to the measurement system, the reference signal is preferably supplied to at least one additional reference signal output. In this manner, the supply point of the signal generated by the device under test can be connected to this additional reference signal output in the signal path leading to the measuring device. A calibration can therefore also be implemented taking into consideration the cable used, for example, by the customer, for connecting the measurement system to the device under test.

A first switching element and at least one second switching element are preferably provided in the switching device according to the invention. Via the first switching element, the first measuring-device port is connected alternately to the first measurement port or to the common reference signal input. Correspondingly, via at least one second switching element, in each case, a second measuring-device port is connected alternately in each case to a second measurement port or to the common reference signal input. Accordingly, the switching device is set up in such a manner that one measuring-device port is provided respectively for each of the coupled measuring devices. In this context, one switching element is allocated to each of these measuring-device ports, through which the measuring-device port can be connected either to the reference signal or to the respectively allocated measurement port. The provision in each case of exactly one switching element in each of the possible signal paths provides the advantage that identical signal-path lengths can be realised in a simple manner within the switching device.

By preference, a third switching element is provided in a common portion of the signal path of the reference signal. The third switching element is disposed between the reference signal input and the first or second switching elements. An improved de-coupling of the reference signal input from the measurement ports is achieved through the provision of a third switching element.

Furthermore, at least one reference signal output, which is connected to the reference signal input, is provided in the switching device. Through this additional reference signal output, it is possible to use the reference signal for the calibration of the measuring devices with regard to delay-time differences, which occur through the cable, with which the device under test is connected to the switching device.

Moreover, a trigger-signal input is also preferably provided in the switching device. The switching elements in this context are set up particularly in such a manner that they can be activated by means of a trigger signal disposed at the trigger-signal input. In particular, it is advantageous to provide in the switching device a first trigger-signal output and at least one second trigger-signal output, which is connected to the trigger-signal input of the switching device. In this context, the structure of the switching device is preferably symmetrical. This means that a trigger signal disposed at the trigger-signal input provides identical delay times to the first trigger-signal output and the at least one trigger-signal output. When using several additional reference signal outputs, which are connected to the reference signal input, it is also preferable for the delay time between the reference signal input and the respective reference signal outputs to be identical.

Figure 2:
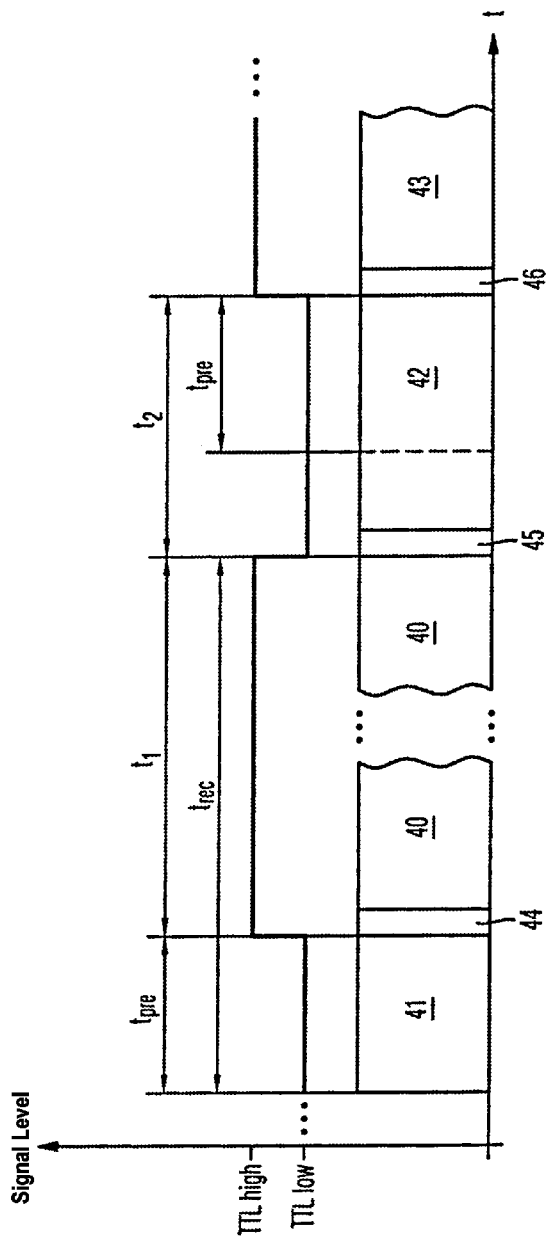

One preferred embodiment of the method according to the invention, the switching device according to the invention and the measurement system is presented in a simplified manner in the drawings and explained in greater detail in the description below. The drawings are as follows:

FIG. 1 shows a block-circuit diagram of a measurement system according to the invention with a switching device according to the invention for the implementation of the method according to the invention; and FIG. 2 shows a diagram for the time sequence during the implementation of the method according to the invention.

FIG. 1 shows a block-circuit diagram of a measurement system 1 according to the invention for the implementation of the method according to the invention. The measurement system 1 comprises a first measuring device 2, a second measuring device 3, a switching device 4 and a signal generator 5. The measurement system 1 is provided for the measurement of two high-frequency signals generated by a device under test. In the exemplary embodiment presented, the device under test is a mobile radio device 6.

The first measuring device 2 and the second measuring device 3 are coupled to one another. The coupling is implemented via a common time basis signal. In the exemplary embodiment presented, the common time basis signal is generated by the second measuring device 2 or made available via the first measuring device 2 and communicated via a line 7 to the second measuring device 3. Accordingly, a common time basis, to which the two measuring devices 2, 3 are synchronised, is available to both of the coupled measuring devices 2, 3.

The first measuring device 2 provides a first test-signal input 8. Correspondingly, the second measuring device 3 provides a second test-signal input 9. The exemplary embodiment presented is limited to the coupling of only the first measuring device 2 and one second measuring device 3. However, it is equally possible to integrate further measuring devices into the measurement system 1. The following deliberations made with reference to the second measuring device 3 or the allocated connections of the switching device 4 apply correspondingly to every further, second measuring device.

Alongside the respective test-signal input 8 and 9 of the first measuring device 2 or of the second measuring device 3, a trigger-signal input 10 and 11 is also provided on each of the measuring devices 2, 3. The recording of the test signal or the take-up of signal data by the first measuring device 2 and the second measuring device 3 can be controlled and accordingly time-matched with one another via a trigger signal supplied to the trigger inputs 10, 11.

For the supply of the test signal or a reference signal, a first measuring-device port 12 of the switching device 4 is connected, in a manner to be described below, to the test-signal input 8 of the first measuring device 2. Furthermore, a second measuring-device port 3, which is connected to the test-signal input 9 of the second measuring device 3, is provided in the switching device 4. In order to connect the mobile radio device 6 to be tested to the measurement system 1 according to the invention, a first measurement port 14 and a second measurement port 15 is also formed in the switching device 4. The first measurement port 14 is connected to a first test port 16 of the mobile radio device 6, and the second measurement port 15 is connected to a second test port 17 of the mobile radio device 6. A first cable 18 and a second cable 19 are used to connect the measurement ports 14, 15 to the corresponding test ports 16, 17 of the mobile radio device 6.

For the supply of the high-frequency signal output via the first test port 16 or respectively the second test port 17 of the mobile radio device 6 to the first measuring device 2 or respectively the second measuring device 3, the first measuring-device port 12 can be connected to the first measurement port 14, and the second measuring-device port 13 can be connected to the second measurement port 15 within the switching device 4 in a manner described in detail below.

In order to connect not only the measuring-device port 12 or 13 to the respectively-allocated measurement port 14 or 15 via the switching device 4, a first switching element 20 and a second switching element 21 are provided in the switching device 4. In the exemplary embodiment presented, the switching elements 20, 21 are disposed in a position, in which the measuring-device ports 12 and 13 are each connected to the allocated measurement ports 14 and 15. If the switching elements 20 and 21 are activated, they are brought into their respective second switching position, in which a common reference signal is supplied to the measuring devices 2 and 3.

A signal generator 5 is provided for the generation of the common reference signal. The signal generator 5 is connected to a reference signal input 22 of the switching device 4. For the supply of the reference signal to the measuring devices 2, 3, a reference signal line 23 is provided in the switching device 4. The reference signal line 23 is divided into a first signal branch 24 and a second signal branch 24'. The first signal branch 24 conducts the reference signal to the first switching element 20, while the second signal branch 24' conducts the reference signal to the second switching element 21. A third switching element 25 is disposed in the reference signal line 23. This third switching element 25, disposed between the first switching element 20 and the second switching element 21 and the reference signal input 22, and accordingly arranged in the common portion of the signal path of the reference signal, is used to improve the de-coupling of the reference signal input 22 from the first switching element 20 and the second switching element 21.

While in the exemplary embodiment presented, the first switching element 20 and the second switching element 21 each connect the first measuring-device port 12 via a first test-signal line 26 to the first measurement port 14 and the second measuring-device port 13 via a second test-signal line 27 to the second measurement port 15, in the respectively other switching position of the first switching element 20 or of the second switching element 21, the first signal branch 24 is connected to the first measuring-device port 12 or respectively the second signal branch 25 is connected to the second measuring-device port 13.

Accordingly, if the first switching element 20 is moved into its second switching position, the reference signal generated by the signal generator 5 is supplied to the test-signal input 8 of the first measuring device 2. At the same time, if the second switching element 21 is disposed in its second switching position, the reference signal of the signal generator 5 is also supplied to the test-signal input 9 of the second measuring device 3. The third switching element 25 is disposed in the position illustrated in FIG. 1, in which the first signal branch 24 and the second signal branch 24' are connected via the reference signal line 23 to the reference signal input 22.

Moreover, the reference signal input 22 is additionally connected via two further line branches to a first reference signal output 28 and to a second reference signal output 29. Accordingly, the reference signal generated by the signal generator 5 can be picked up equally at the first reference signal output 28 or respectively at the second reference signal output 29. In this case, the line paths between the reference signal input 22 and the first reference signal output 28 or the second reference signal output 29 are identical, so that a delay-time difference between the reference signal disposed at the first reference signal output 28 or at the second reference signal output 29 does not occur.

In a corresponding manner, the delay times of the reference signal from the reference signal input 22 towards the first switching element 20 via the first signal branch 24 or respectively to the second switching element 21 via the second signal branch 25 are constant. Accordingly, up to the first switching element 20 or respectively up to the second switching element 21, a time difference between the reference signal supplied to the test-signal input 8 of the first measuring device 2 or respectively the test-signal input 9 of the second measuring device 3 also does not occur. All of the time differences, which occur between a sampled signal in the first measuring device 2 or respectively a sampled signal in the second measuring device 3, therefore have their origin in the respective signal path disposed between the first switching element 20 or the second switching element 21 and the sampling in the first measuring device 2 or the second measuring device 3.

A trigger signal is used for the time control of the measurement operation. In this context, the first measuring device 2 and the second measuring device 3 in the illustrated exemplary embodiment of a measurement system 1 according to the invention do not provide a hardware-implemented trigger output. However, a controllable output 31 is provided in the first measuring device 2. This controllable output 31 is controlled by control software executed in the first measuring device 2. The controllable output 31 can, for example, be a connection of an interface 30 provided in the first measuring device 2. Such an interface 30 can be, for example, a serial port, a printer port or similar controllable port. The controllable output 31 is connected to a trigger input 32 of the switching device 4. The trigger input 32 is connected to a branching point 33 in the switching device 4. The branching point 33 in turn is connected to a first trigger-signal output 34 and a second trigger-signal output 35 of the switching device 4. Furthermore, the trigger signal supplied via the trigger input 32 acts on the first switching element 20, on the second switching element 21 and also on the third switching element 25. In FIG. 1, this is indicated schematically by the arrows 36, 37 and 38. The trigger input 32 is designed, for example, as a BNC socket, across which a TTL signal can be connected. In this context, if a level change from "TTL high" to "TTL low" occurs at the trigger input 32, the switching elements 20, 21 and 25 are activated and moved into their respectively other switching position. This will be explained in greater detail below with reference to FIG. 2.

The line lengths for the trigger signal within the switching device 4 are preferably identical starting from the connecting point 33 and the first trigger-signal output 34 or respectively the second trigger-signal output 35, so that a delay-time difference of the trigger signals within the switching device 4 does not occur.

For the implementation of the method according to the invention, the signal generator 5 is set to a frequency, which corresponds approximately to the mid-frequency of the test frequency set in the measuring devices 2 and 3. The control of the signal generator 5 is preferably implemented via control software, which is preferably worked through in the first measuring device 2. In the illustrated, preferred exemplary embodiment of FIG. 1, the switching device 4 does not provide its own power supply. The power supply of the switching device 4 is preferably realised via a USB port, which is not illustrated, but which is connected to the first measuring device 2. As an alternative, another external power supply can also be connected to the switching device 4. However, internal power supplies with transformers should be avoided.

In order to implement a high-quality measurement, a de-coupling of the signal paths for the reference signal and the actual test signal is necessary. This is preferably greater than 60 dB, wherein a particularly good de-coupling is achieved by the third switching element 25, which is opened during the supply of a test signal to the test-signal input 8 of the first measuring device 2 and of the test-signal input 9 of the second measuring device 3. The measurement port 14 and the measurement port 15 are preferably de-coupled with at least 80 dB.

The first measurement port 14 and the second measurement port 15 are, in particular, connected in a manner which is not illustrated, via a surge protection to the first switching element 20 and respectively the second switching element 21.

The switching elements 20, 21 and 25 are designed for a maximum switching frequency of 10 Hz. To allow a user to check the correct implementation of a measurement, control devices are also provided on the switching device 4, which display, for example, the switch position of the switching elements 20, 21 and 25, the presence of a reference signal and of a trigger signal. Such control devices can be realised in a particularly simple manner as LEDs.

In implementing the method according to the invention, it must first be ensured, via the connecting line 7, that the first measuring device 2 and the second measuring device 3 are operating on an identical time basis. The time basis signal required for this purpose is generated in the illustrated preferred exemplary embodiment by the first measuring device 2 and communicated via the line 7 to the second measuring device 3. After the start of a measurement to be implemented, a trigger signal is initially issued via the controllable output 31 by the control software running in the first measuring device 2, and this is supplied to the trigger input 32 of the switching device 4. Following this, the switching elements 20, 21 and 25 are activated in such a manner that the reference signal provided at the reference-signal input 22 is supplied to the measuring devices 2 and 3 via the switching elements 25, 20 and 21. After the expiration of a given time interval, which will be explained in greater detail with reference to FIG. 2, for example, the signal capable of being output via the controllable output 31 is now set in such a manner that the first switching element 20, the second switching element 21 and the third switching element 25 are now moved into their respectively other position. Accordingly, the first measuring-device port 12 is now connected to the first measurement port 14, and the second measuring-device port 13 is now connected to the second measurement port 15. At the same time, for improved de-coupling, the third switching element 25 is moved into its opened position. In this switching position, a signal, which is generated by the mobile radio device 6 and output via the first test port 16 or respectively the second test port 17, is supplied in each case to the first measuring device 2 and to the second measuring device 3. In this context, the first test signal or the second test signal sampled in the first measuring device 2 or respectively in the second measuring device 3 provide a relative time position relative to the common reference signal. Since the reference signal is a common reference signal, which provides no delay-time difference up to the feeding in to the signal path of the first test signal or respectively the signal path of the second test signal at the first switching element 20 or the second switching element 21, the time difference between the first test signal and the second test signal is obtained from the relative time position of the first test signal relative to the reference signal in the first measuring device 2 or respectively the relative time position of the second test signal in the second measuring device 3. Accordingly, by evaluating this time difference determined in this manner, a time correlation between the first test signal and the second test signal can be generated and taken into consideration in an analysis of the measured signals by the first or respectively second measuring device 2, 3.

By preference, before every recording of a first or respectively second test signal, which is generated by the mobile radio device 6 and output via the first test port 16 or respectively the second test port 17, the common, frequency-matched reference signal of the signal generator 5 is supplied over a given period of time to the first measuring device 2 or respectively to the second measuring device 3.

The periodic switching between the levels "TTL high" and "TTL low" at the controllable output 31 is activated by the control software. Accordingly, it is possible to establish, in particular, over which time period the reference signal should be supplied to the measuring devices 2 and 3, and which time period should be provided for the recording of the two test signals at the test-signal input 8 of the first measuring device 2 and the test-signal input 9 of the second test signal 3. These time intervals can be adjusted by a user and implemented in a simple manner via the control software by realising the trigger signal across a controllable output 31.

In addition to the different delay times of the signals at the end of the switching elements 20, 21 facing towards the measuring devices 2, 3 and the resulting time difference between the first test signal and the second test signal, which are sampled in the first measuring device 2 or the second measuring device 3, further delay-time differences can occur at the end of the first switching element 20 or of the second switching element 21 facing towards the mobile radio device 6. On the one hand, these can occur through the first test-signal line 26 or the second test-signal line 27 and, on the other hand, through the cable 18, 19 used. While an identical delay time over the first test-signal line 26 or the second test signal line 27 can be ensured by manufacturing the switching device 4 accordingly, a use of different cable lengths for the cables 18 and 19 cannot be excluded. In order also to register these delay-time differences in the calibration of the measuring devices 2 and 3, the end of the cable 18 connected to the first test port 16 is connected to the first reference-signal output 28. At the same time, the second cable 19 is connected by the end connected to the second test port 17 to the second reference-signal output 29. As has already been explained above, since the reference signal is fed from the first reference-signal output 28 and the second reference-signal output 29 without delay-time differences in the signal branch used for the measurement via the first cable 18 or respectively the second cable 19, the delay-time difference occurring up to the switching elements 20, 21 relative to the reference signal can therefore be determined in a manner already described above by alternate supply of the reference signal via the first signal line branch 24 or respectively the second signal line branch 24', the first test-signal line 26 or respectively the second test-signal line 27.

The operation of the method according to the invention is explained in greater detail below with reference to FIG. 2. Initially, a low level TTL signal is provided at the controllable output 31. The first switching element 20 therefore connects the first measuring-device port 12 to the first signal branch 24. By contrast, the second switching element 21, connects the second measuring-device port 13 to the second signal branch 24'. The third switching element 25 is in its position illustrated in FIG. 1, so that the reference signal, which is generated by the signal generator 5, is supplied to the test-signal input 8 of the first measuring device 2 and to the test signal 9 of the second measuring device 3. After the expiration of a first time period $t_{pre}$ (pre-trigger), the trigger signal is set to "high" at the controllable output 31. As a result, the first switching element 20 and the second switching element 21 are activated and moved into their position illustrated in FIG. 1.

At the same time, the third switching element 25 is opened. The first and respectively the second test signal are now disposed at the test-signal input 8 or the test-signal input 9 of the first measuring device 2 and respectively of the second measuring device 3. After the expiration of a time period $t_1$, the trigger signal disposed at the controllable output 31 is reset and, as a result, the switching elements 20, 21 and 25 are again moved to their respectively other position. The common reference signal is now once again supplied to the first measuring device 2 and to the second measuring device 3. The trigger signal at the controllable output 31 remains on "low" for so long as is specified by an adjustable second time period $t_2$. The adjustable time period $t_2$ is composed of a minimum time period (pre-trigger) $t_{pre}$, the time period required for the activation of the switching elements 20, 21 and 22 and a small time supplement.

After the expiration of this second time period $t_2$, the trigger signal is reset to "high". The operation of the method described above is repeated periodically.

FIG. 2 initially presents a block 41, which corresponds to the recording of the reference signal by the first measuring device 2 and the second measuring device 3. The setting of the trigger signals to "high", is followed by a time segment 44, in which the switching elements 20, 21 and 25 are moved into their respectively other position. The time period for the activation of the switching elements 20, 21 and 25 is typically approximately 10 μs. After the switching of the switching elements 20, 21 and 25, the actual recording of the first and of the second test signal takes place. This is presented as the time block 40, the interruption of which is supposed to show that the illustrated relationships in FIG. 2 need not necessarily correspond to the time relationships in the implementation of a real measurement. The first time period $t_1$, in which the trigger signal is set to "high", is therefore composed of the recording time for the switching of the switching elements 20, 21 and 25 plus a recording time adjustable by the customer. The total recording period $t_{rec}$ in this context is composed of $t_1$ and the pre-trigger time $t_{pre}$. The additional time component in the second time period $t_2$ is composed from the time period, which the measuring devices 2 and 3 require in order to be ready for operation again after the conclusion of such a recording period $t_{rec}$. Accordingly, after the switching elements 20, 21 and 25 have been moved back into their respectively other switching position in the time block 45, and this additional time period has elapsed, the pre-trigger time $t_{pre}$ begins once again in time block 42, in which the reference signal is recorded by the first measuring device 2 and the second measuring device 3. Once again, this is followed by a time block 46, in which the switching elements 20, 21 and 25 are re-activated, before the actual test signals are once again recorded in time block 43. The respective start of the recordings is also time controlled via the trigger signal, for which purpose the trigger-signal input 10 or the trigger-signal input 11 of the first measuring device 2 or respectively of the second measuring device 3 is connected to the trigger-signal output 34 or to the second trigger-signal output 35. In this context, the identical delay time of the trigger signal within the switching device 4 ensures that the start of a measurement is implemented synchronously.

The method described, the measurement system described and the switching device are provided from $P_{in}$ max minimal =20 dBm to $P_{in}$ min 0-60 dBm. The adjustable frequencies of the first measuring device 2 and of the second measuring device 3 and accordingly also the corresponding frequency of the common reference signal in this context extends from approximately 40 mHz to 8 GHz.

An unambiguous allocation of the relative position of the test signal to the reference signal is possible only within a time window of one period of the reference signal. In order to determine larger time differences between the first and the second test signal in the sampling of the test signal by the first measuring device 2 and the second measuring device 3, the signal generator 5 can initially be operated with a relatively lower frequency. This set frequency of the reference signal can then be increased, for example, successively up to the mid-frequency of the set frequency of the measuring device 2, 3. Accordingly, a time offset, which is greater than one period of the mid-frequency of the set test frequency of the first measuring device 2 and of the second measuring device 3, can also be detected.

The invention is not restricted to the exemplary embodiment presented. On the contrary, combinations of individual features of the preferred exemplary embodiment are also possible.

The invention claimed is:

1. A method for determining time differences between test signals measured by at least two coupled measuring devices, wherein the at least two coupled measuring devices comprise and correspond to a first measuring device and at least one second measuring device, comprising:
   generating a time basis signal for the at least two coupled measuring devices, in that one of the at least two coupled measuring devices generates and supplies a common time basis signal for the at least two coupled measuring devices;
   generating a common reference signal by a signal generator and providing the common reference signal to a reference-signal input of a switching device comprising a first switching element and at least one second switching element, wherein a first measuring-device port of the switching device is connected to the first measuring device and is connected by the first switching element alternately to either a first measurement port of the switching device or to the reference-signal input of the switching device, and respectively at least one second measuring-device port of the switching device is connected to the at least one second measuring device and is alternately connected by the at least one second switching element to either a second measurement port of the switching device or to the reference-signal input of the switching device;
   switching the first switching element and the at least one second switching element to supply simultaneously the common reference signal to the first measuring-device port and the at least one second measuring-device port or to supply the test signals received at the first measurement port and at the at least one second measurement port to the respectively allocated first measuring-device port and at least one second measuring-device port;
   wherein the switching device periodically switches between either supplying the common reference signal or the test signals via the first measuring-device port to a first test signal input of the first measuring device and via the at least one second measuring-device port to at least one second test signal input of the at least one second measuring device during a measurement determining the relative time position of each test signal of the test signals relative to the common reference signal by the respective first measuring device and the at least one second measuring device;

determining, by the first measuring device or the at least one second measuring device, the time differences between the test signals received at the first measurement port and the at least one second measurement port from the determined relative time positions of each test signal of the test signals.

2. The method according to claim 1, further comprising: synchronously switching between the supply of the common reference signal and the test signals with a trigger signal generated by one of the said measuring devices.

3. The method according to claim 2, further comprising: generating the trigger signal from a controllable output port of one of the measuring devices in order to control the synchronous switching.

4. The method according to claim 2, further comprising: synchronously supplying the trigger signal to a trigger input of each one of the coupled measuring devices and of the switching device.

5. The method according to a claim 4, wherein: the trigger signal is generated by control software in the measuring device.

6. The method according to claim 1, further comprising: determining total delay-time differences occurring in the case of a connection of a device under test to the measurement system by supplying the reference signal to at least one reference-signal output.

7. A switching device for determining time differences between a first and at least one second test signal using a first measuring device and at least one second measuring device, the switching device comprising:

a first measuring-device port connected to a first test signal input of the first measuring device;

at least one second measuring-device port connected to at least one second test signal input of the at least one second measuring device;

a reference-signal input;

a first switching element and at least one second switching element, wherein the first measuring-device port is connected by the first switching element alternately to either a first measurement port of the switching device or the reference-signal input, and respectively the at least one second measuring-device port is alternately connected by the at least one second switching element to either a second measurement port of the switching device or to the reference-signal input, wherein the first switching element and the at least one second switching element are configured to be switched to supply either simultaneously the common reference signal to the first measuring-device port and the at least one second measuring-device port or to supply test signals received at the first measurement port and the at least one second measurement port to the respectively allocated first measuring-device port and at least one second measuring-device port; and wherein the switching device is configured to control the first and the second switching element to perform periodically switching between either supplying the common reference signal or the test signals via the first measuring-device port to the first test-signal input and via the at least one second measuring-device port to the at least one second test-signal input during a measurement.

8. The switching device according to claim 7, further comprising:
a third switching element in a reference-signal path for de-coupling the reference-signal input between the reference-signal input and the first and at least one second switching elements.

9. The switching device according to claim 7, further comprising:
at least one reference-signal output, which is connected to the reference-signal input.

10. The switching device according to claim 8, further comprising:
a trigger-signal input wherein the first, second, and third switching elements are configured to be synchronously activated by a trigger signal applied to the trigger-signal input.

11. The switching device according to claim 10, wherein:
the trigger-signal input of the switching device is connected to a first trigger-signal output and to at least one second trigger-signal output.

12. A measurement system comprising:
a first measuring device and at least a second measuring device each having at least one test-signal input, wherein the first measuring device and the at least one second measuring device are clocked by a common time basis supplied by the first measuring device; and
a switching device comprising a first switching element and at least one second switching element,
wherein a test-signal input of the first measuring device is connected to a first measuring-device port of the switching device, and a test-signal input of the at least one second measuring device is connected to at least one second measuring-device port of the switching device,
wherein the first measuring-device port is connected by the first switching element alternately to either a first measurement port of the switching device or a reference-signal input, and respectively the at least one second measuring-device port is connected to the at least one second measuring device and is alternately connected by the at least one second switching element to either a second measurement port of the switching device or to the reference-signal input,
wherein the first switching element and the at least one second switching element are configured to be switched to supply simultaneously a common reference signal received at the reference-signal input to the first measuring-device port and at least one second measuring-device port or to supply test signals received at the first measurement port and the at least one second measurement port to the respectively allocated first measuring-device port and at least one second measuring-device port;
wherein the switching device periodically switches between supplying either the common reference signal or the test signals via the first measuring device port to a first test signal input of the first measuring device and via the at least one second measuring-device port to at least one second test signal input of the at least one second measuring device during a measurement;
wherein the first measuring device is configured to determine a relative time position of a first test signal and the at least one second measuring device is configured to determine a relative time position of the at least one second test signal of the received test signals with respect to the common reference signal, and the first measuring device or the at least one second measuring device is configured to determine an exact time position of the first test signal and the at least one second test signal relative to one another from the determined relative time positions of the first test signal and the at least one second test signal.

* * * * *